United States Patent
Roham et al.

(10) Patent No.: US 9,379,731 B1
(45) Date of Patent: Jun. 28, 2016

(54) CLOSED LOOP LINEARIZED VCO-BASED ADC

(71) Applicant: QUALCOMM Incorporated, San Diego, CA (US)

(72) Inventors: Masoud Roham, San Diego, CA (US); Mohammad Meysam Zargham, San Diego, CA (US); Li Lu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/863,200

(22) Filed: Sep. 23, 2015

(51) Int. Cl.
    H03M 1/12    (2006.01)
    H03M 1/60    (2006.01)

(52) U.S. Cl.
    CPC ...................... H03M 1/60 (2013.01)

(58) Field of Classification Search
    CPC .............................. H03M 1/60; H03M 1/0621
    See application file for complete search history.

(56) References Cited

U.S. PATENT DOCUMENTS

| 6,542,105 B2 * | 4/2003 | Sakuragi | H03M 1/16 341/155 |
| 7,982,550 B1 | 7/2011 | Quevy et al. | |
| 8,144,047 B2 * | 3/2012 | Lin | H03M 1/52 341/155 |
| 8,421,663 B1 * | 4/2013 | Bennett | H03M 1/0678 341/155 |
| 2009/0063070 A1 | 3/2009 | Renneberg | |
| 2013/0272341 A1 * | 10/2013 | Lee | G01K 7/34 374/184 |
| 2014/0086279 A1 | 3/2014 | Cao et al. | |

FOREIGN PATENT DOCUMENTS

EP    2775626 A1    9/2014

OTHER PUBLICATIONS

Rethy J.V., et al., "Supply-Noise-Resilient Design of a BBPLL-Based Force-Balanced Wheatstone Bridge Interface in 130-nm CMOS," IEEE Journal of Solid-State Circuits, Nov. 2013, vol. 48 (11), pp. 2618-2627.

* cited by examiner

Primary Examiner — Khai M Nguyen
(74) Attorney, Agent, or Firm — Procopio, Cory, Hargreaves & Savitch, LLP (57) ABSTRACT

A device and method for analog to digital conversion is disclosed. The device can have a first amplifier operable to receive an input voltage and output a first control signal. The device can also have a first voltage-controlled oscillator (VCO) operably coupled to the first amplifier and configured to output a first signal based on the first control signal, the first signal having a sensor frequency. The device can also have a first switched-capacitor resistor operably coupled to the first VCO and to the first amplifier, the first switched-capacitor resistor configured to receive and be controlled by the sensor frequency. The device can also have a sensor counter operably coupled to the first VCO and configured produce a sensor count based on the sensor frequency. The device can also have a register configured provide a digital output proportional to the input voltage based on the sensor count.

30 Claims, 5 Drawing Sheets

CLOSED LOOP LINEARIZED VCO-BASED ADC

BACKGROUND

1. Technological Field

This disclosure relates to sensors for various digital chipsets and integrated circuits (IC). More specifically, this disclosure relates to temperature sensing at various locations across digital ICs.

2. Related Art

Modern very large scale integration (VLSI) chipsets and SoCs (System on Chip) implement various types of sensors throughout an IC. Accurate and reliable temperature sensing across the digital chips is an important element in thermal management and mitigation schemes for ICs. Such plans can be a key factor in power consumption and circuit performance. Temperature sensing can be a critical aspect of IC performance, where 1° C. error can translate to as much as one percent performance loss in mobile system modems (MSM). Some thermal sensors can include a main sensor with multiple passive remote sensors spread throughout the IC. Remote sensors can provide a sensor output indicative of temperature. A controller can periodically poll the remote sensors to determine temperature variations across the IC and provide the sensor outputs to a main sensor. The requirement for more sensors increases with IC complexity and capability, but the number of sensors implemented in an IC is limited by ever-shrinking size constraints of ICs.

Voltage controlled oscillators (VCO) can be useful as data converters due to the low power requirements, high speed, and ease of integration into ICs. Such VCOs can be configured to receive and aggregate the sensor outputs for use by a controller. However, VCOs may have a nonlinear frequency response to temperature, and therefore can require additional circuitry to address such nonlinearity to measure temperature more reliably.

SUMMARY

In general, this disclosure describes systems and methods related to sensors implemented in ICs. More particularly, this disclosure provides systems and methods for temperature sensing across ICs using closed loop linearized VCO-based analog-to-digital converters (ADC), to address the inverse proportionality of VCO-based ADCs. The systems, methods, and devices of this disclosure each have several innovative aspects, no single one of which is solely responsible for the desirable attributes disclosed herein.

One aspect of the disclosure provides a device for analog to digital conversion. The device can have a first amplifier operable to receive an input voltage and output a first control signal. The device can also have a first voltage-controlled oscillator (VCO) operably coupled to the first amplifier and configured to output a first signal based on the first control signal, the first signal having a sensor frequency. The device can also have a first switched-capacitor resistor operably coupled to the first VCO and to the first amplifier, the first switched-capacitor resistor configured to receive and be controlled by the sensor frequency. The device can also have a sensor counter operably coupled to the first VCO and configured produce a sensor count based on the sensor frequency. The device can also have a register configured provide a digital output proportional to the input voltage based on the sensor count.

Another aspect of the disclosure provides a method for analog to digital conversion. The method can include amplifying an input voltage to form a first control signal using a first amplifier. The method can also include generating a first signal having a sensor frequency based on the first control signal using a first voltage-controlled oscillator (VCO). The method can also include controlling a resistance of a first switched-capacitor resistor using the sensor frequency. The first switched-capacitor resistor can be operably coupled to the first VCO and to the first amplifier. The method can also include counting the sensor frequency to produce a sensor count. The method can also include producing a digital output proportional to the input voltage based on the sensor count.

Another aspect of the disclosure provides an apparatus for analog to digital conversion. The apparatus can include means for amplifying an input voltage to form a first control signal. The apparatus can also include means for generating a first signal having a sensor frequency based on the first control signal. The apparatus can also include means for providing a first variable resistance based on the sensor frequency. The apparatus can also include means for counting configured to count the sensor frequency to produce a sensor count. The apparatus can also include means for producing configured to produce a digital output proportional to the input voltage based on the sensor count.

Another aspect of the disclosure provides a device for analog to digital conversion. The device can have a first closed loop voltage controlled oscillator (VCO) having a sensor input configured to receive a sensor voltage. The first closed loop VCO loop can be configured to generate a sensor signal having a sensor frequency inversely proportional to the sensor voltage. The device can also have a second closed loop VCO having a reference input configured to receive a reference voltage. The second closed loop VCO loop can be configured to generate a reference signal having a reference frequency inversely proportional to the reference voltage. The device can also have an input counter operably coupled to the first VCO loop and configured produce an input count based on the sensor frequency. The device can also have a reference counter operably coupled to the reference output and configured to produce a reference count based on the reference frequency. The device can also have a register operably coupled to the sensor counter and the reference counter. The register can be configured to provide a digital output proportional to the sensor input based on the input count and the reference count.

Other features and advantages of the present disclosure should be apparent from the following description which illustrates, by way of example, aspects of the disclosure.

BRIEF DESCRIPTION OF THE FIGURES

The details of embodiments of the present disclosure, both as to their structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various embodiments and is not intended to represent the only embodiments in which the disclosure may be practiced. The detailed description includes specific details for the purpose of providing a thorough understanding of the embodiments. However, it will be apparent to those skilled in the art that the disclosure without these specific details. In some instances, well-known structures and components are shown in simplified form for brevity of description.

Figure 1:
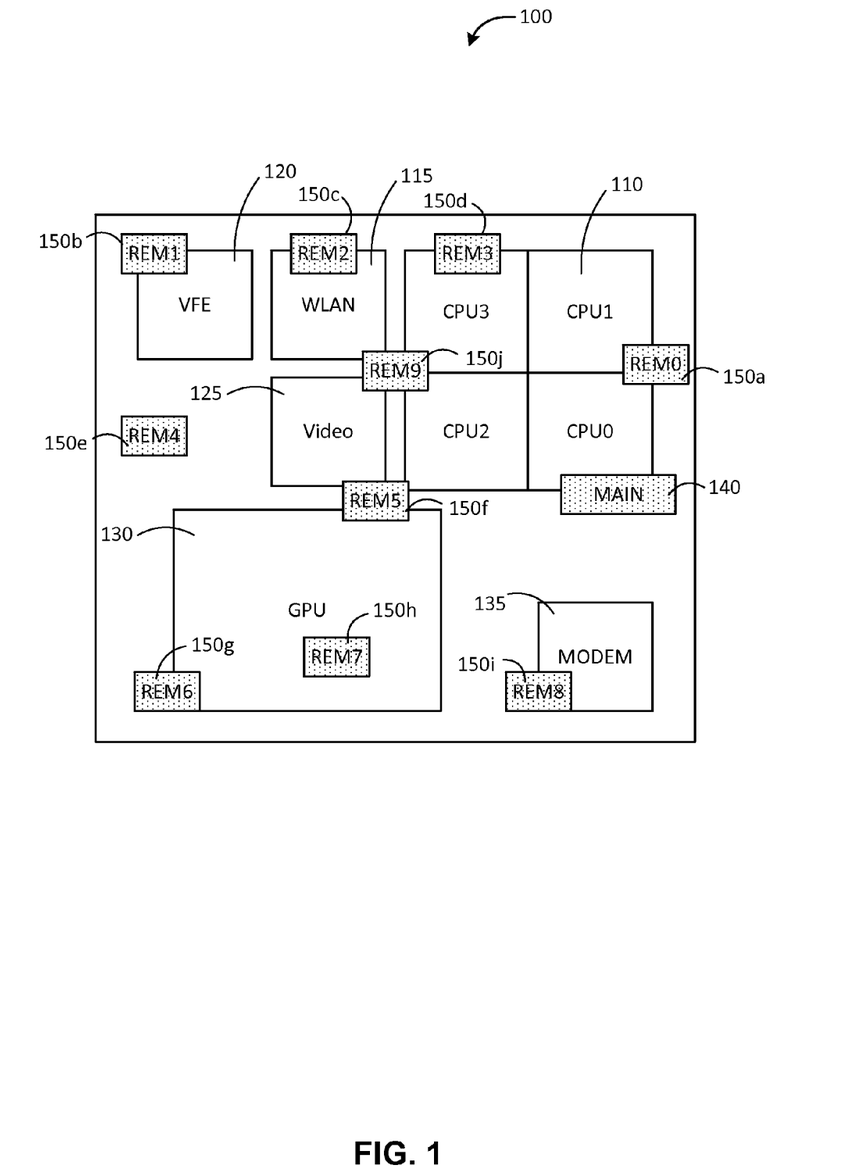
FIG. 1 is a functional block diagram of an integrated circuit.

FIG. 1 is a functional block diagram of an integrated circuit. An IC 100 can be a SoC or other IC having multiple subcomponents. The IC 100 can have a multi-core processor (processor) 110. The IC 100 can also have a wireless local area network (WLAN) processor 115, a Video Front End (VFE) 120, a video processor 125, a graphics processing unit (GPU) 130, and a MODEM (modulator-demodulator) 135. Each of the foregoing components can be operably coupled to one another in order to perform the functions of the IC 100. The IC 100 can be, for example, a SoC in a wireless mobile device.

The IC 100 can also have a plurality of sensors. The sensors can be arranged as a main sensor 140 with multiple remote sensors 150. Each of the individual remote sensors 150 is labeled with a letter, 150a-150j. While there are 10 remote sensors 150 shown, this should not be considered limiting. More or fewer remote sensors 150 can be implemented in the IC 100. In some embodiments, more than one main sensor 140 can also be used along with respective arrays of remote sensors 150. The remote sensors 150 can be distributed around the IC 100 and provide a measurement of the temperature of the IC 100 at the various locations of the IC 100. The temperature measurements can provide an indication of temperature distribution across the IC 100 and allow the CPU 110 to monitor and control the various processes of the IC 100. This can allow the CPU 110 to influence or control IC 100 temperature and maximize efficiency and battery life.

Figure 2:
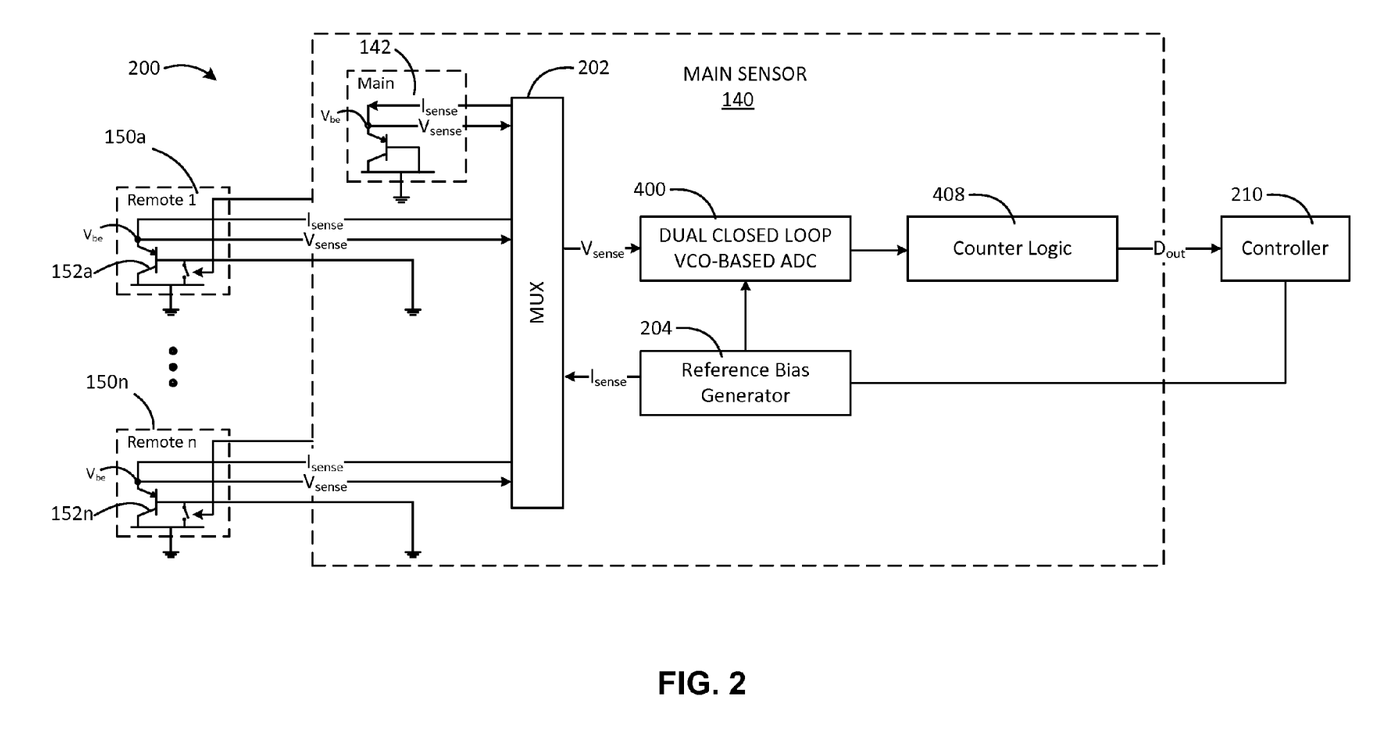
FIG. 2 is a functional block diagram of a temperature sensor system.

FIG. 2 is a functional block diagram of a temperature sensor system. A temperature sensor system 200 can have the main sensor 140 (shown in dashed lines) and multiple remote sensors 150, as shown. The main sensor 140 can have a main sensing unit 142. The main sensing unit 142 and the remote sensors 150 can be operably coupled to a multiplexor (MUX) 202 and sense temperature of the IC 100 in the area of the IC 100 in which the remote sensors 150 are located. Each of the main sensing unit 142 and the remote sensors 150 can have, for example, one or more a bipolar junction transistors (BJT) 152 for use as a temperature sensor. In some embodiments, a base to emitter voltage ($V_{be}$) of a BJT varies with temperature. Accordingly, the output $V_{sense}$ of each of the remote sensors 150 coupled to an input that supplies the output voltage $V_{be}$. While the base-emitter voltage $V_{be}$ is used as an exemplary measure of temperature herein, this should not be considered limiting.

The MUX 202 can receive temperature measurements (e.g., $V_{be}$) from each of the main sensing unit 142 and the remote sensors 150. The MUX 202 can aggregate and distribute the temperature measurements to a dual closed loop VCO-based ADC (ADC) 400. This can allow the ADC 400 to poll or otherwise periodically or intermittently receive temperature measurements from each remote sensor 150 across the IC 100.

The ADC 400 can be operably coupled to a reference bias generator 204. The reference bias generator 204 can generate a reference voltage for ADC 400 operations and a sensor current $I_{sense}$ for use by the main sensing unit 142 and the remote sensors 150. The sensor current $I_{sense}$ and the reference voltage are described in more detail in FIG. 4 below.

The ADC 400 can be operably coupled to an array of counter and register circuitry referred to herein as counter logic 408. The counter logic 408 can take the output of the ADC 400 and produce a linear output $D_{out}$ that is directly proportional to the temperature measured by the main sensing unit 142 and the remote sensors 150. This can eliminate the nonlinearity issues encountered using VCO-based ADCs.

The counter logic 408 can be operably coupled to a controller 210. The controller 210 can comprise one or more processors or microprocessors configured to process the linear output $D_{out}$. The controller 210 can be, for example, the processor 110 or only a portion of the processor 110. In some embodiments, the controller 210 can form a portion of or reside on the IC 100. In some embodiments, the controller 210 can be configured to receive the linear output $D_{out}$ and provide temperature indications to other portions of the IC 100, such as the processor 110. The linear output $D_{out}$ can provide necessary temperature information that can be used to influence IC 100 operations. The processor 110 can use such information to reduce processes in portions of the IC 100 in order to, for example, reduce the temperature sensed on a portion of the IC 100. Reduced temperatures across the IC 100 can also lead to more efficient operation and reduced power consumption.

Figure 3:
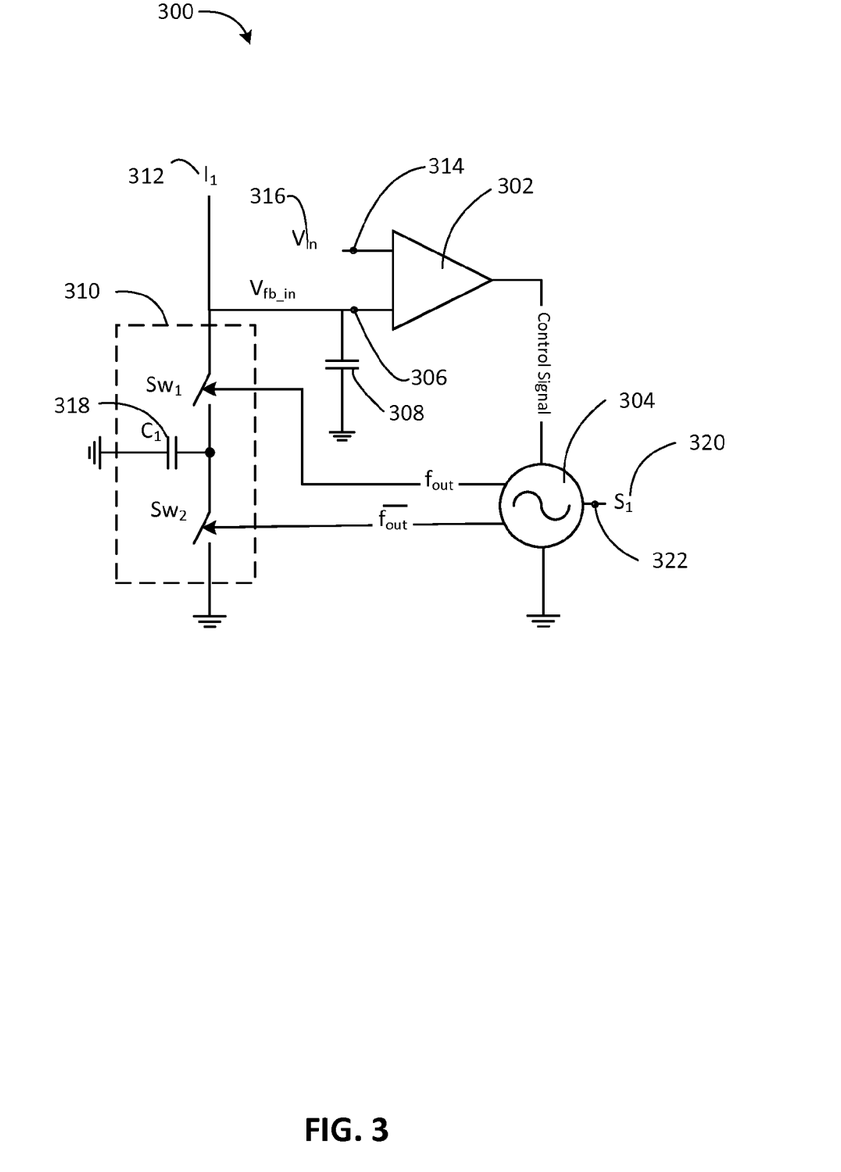
FIG. 3 is a schematic diagram of a closed loop VCO based ADC.

FIG. 3 is a schematic diagram of a closed loop VCO. A closed loop VCO 300 can have an amplifier 302. The amplifier 302 can have a current input 306 in parallel with a capacitance 308 to ground. The capacitance 308 is shown as a capacitor however other components can be used to provide the required functionality of a capacitor. The current input 306 can receive an input current 312 ($I_1$) from a current generator or other suitable source. The input current 312 ($I_1$) is described in more detail in connection with FIG. 4, below. In some embodiments, the reference bias generator 204 can supply the input current 312.

The amplifier 302 can also have a sensor input 314 configured to receive an input voltage 316 ($V_{in}$) from the main sensing unit 142 or the remote sensors 150, for example, as described above. Accordingly, in some embodiments, the input voltage 316 can be equal to $V_{be}$ ($V_{sense}$) of FIG. 2. The amplifier 302 can use the input current 312 and the input voltage 316 to output a VCO control signal to a VCO 304. The VCO control signal can also be referred to as a control signal or a control voltage. Additionally, the VCO control signal can fluctuate based on variations in the value of the input voltage 316 at the sensor input 314.

In some examples, the VCO 304 can be a linear or harmonic oscillator. The VCO 304 can generate a sinusoidal waveform. The VCO 304 can, for example, have a resonator with an amplifier that replaces the resonator losses and isolates the resonator from the output so the load does not affect the resonator. Some examples of harmonic oscillators are inductor-capacitor tank or, LC-tank, oscillators, and crystal oscillators. In a VCO such as the VCO 304, a voltage input controls the resonant frequency. A varactor, varactor diode, or a variable capacitance diode, can be used on conjunction with the resonator. In some examples, the voltage controls a varactor diode's capacitance across the diode. Therefore, a varactor can be used to change the capacitance, and thus the frequency, of an LC tank. A varactor can also change the resonant frequency of a crystal resonator.

In some other examples, the VCO 304 can be implemented as a relaxation oscillator. Relaxation oscillators can generate a sawtooth or triangular waveform and can provide a wide range of operational frequencies with a minimal number of external components. In some examples a ring oscillator can be used. Harmonic oscillator VCOs can have better frequency stability with respect to temperature, noise, and power supply than relaxation oscillators. In some examples, harmonic oscillators can have good accuracy for frequency control since a crystal or tank circuit controls the frequency.

The VCO 304 can have an output 322 that produces an oscillating output signal 320 based on the VCO control signal. The output signal 320 can therefore have an output frequency, $f_{out}$, that can change with variations in the input voltage 316 received at the sensor input 314. In this way, variations in the input voltage 316 (from, e.g., the remote sensors 150) can create variations in an output frequency $f_{out}$ of an output signal 320 ($S_1$) of the VCO 304. More specifically, as the value of the input voltage 316 increases, the output frequency $f_{out}$ of the output signal 320 can decrease. Thus the output frequency $f_{out}$ is inversely proportional to the input voltage 316.

The VCO 304 can be operably coupled to a switched capacitor-resistor (hereinafter, switched-cap) 310, shown in dashed lines. The switched-cap 310 can have a capacitor $C_1$ and switches $Sw_1$ and $Sw_2$ which alternately connect the capacitor $C_1$ to the input and output of the switched-cap 310 with a given frequency. The switched-cap 310 is implemented as a resistive element, made of a capacitance (capacitor $C_1$) 318 and the switches $Sw_1$ and $Sw_2$. The switches $Sw_1$ and $Sw_2$ alternately connect the capacitor $C_1$ 318 to a given signal (e.g., the signal 320 $S_1$) having a frequency (e.g., $f_{out}$). In some examples, non-overlapping signals are used to control the switches, so that both switches $Sw_1$, $Sw_2$ are not closed simultaneously. Each switching cycle transfers a charge from the input to the output at the switching frequency $f_{out}$. Accordingly, the switched-cap 310 behaves as a variable resistor whose value (e.g., resistance, $R_{sw}$) depends on the capacitance of $C_1$ and the switching frequency $f_{out}$. This relationship can be expressed as $R_{sw}=1/(C_1 \times f_{out})$.

The VCO 304 can provide the output signal 320 and an inverted version of the output signal 320 to the switched-cap 310. The inverted version of the output signal 320 can have the same frequency $f_{out}$ but 180 degree phase lag annotated with the "-bar." Thus the VCO 304 can provide nonoverlapping signals having an output frequency $f_{out}$ and an inverted version of the same signal with an output frequency, $f_{out}$-bar to control the switched-cap 310. The output frequency $f_{out}$ and the inverted output frequency, referred to as $f_{out}$-bar (shown graphically in FIG. 3 as "$f_{out}$" with a line over top), can be used to control the switches $Sw_1$ and $Sw_2$ within the switched-cap 310 to vary its resistance $R_{sw}$.

As noted above, the resistance of the switched-cap 310 $R_{sw}$ can vary as the inverse of the product of the output frequency $f_{out}$ and the capacitance 318 $C_1$, or $1/f_{out} \times C_1$. Thus, in some examples, the output frequency $f_{out}$ and the inverted output frequency, $f_{out}$-bar, can cause the switched-cap 310 to produce the resistance $R_{sw}$ that is inversely proportional to the output frequency $f_{out}$. The input voltage 316 $V_{in}$ can thus be expressed as the product of the current 312 and $I_1$ the resistance of the switched-cap 310.

The switched-cap 310 can also be operably coupled to the current input 306 of the amplifier 302. The connection of the VCO 300 to the switched-cap 310 to the amplifier 302 then forms a closed loop, coincident with the name of the closed loop VCO 300. In some embodiments, the closed loop VCO 304 provides a more linear output signal 320 than an open loop VCO.

Thus the closed loop VCO 300 can (using the VCO-controlled switched-cap 310) generate the output signal 320 having the frequency $f_{out}$ that is inversely proportional to the input voltage 316, but has a frequency response with increased linearity over an open loop VCO-based ADC.

Figure 4:
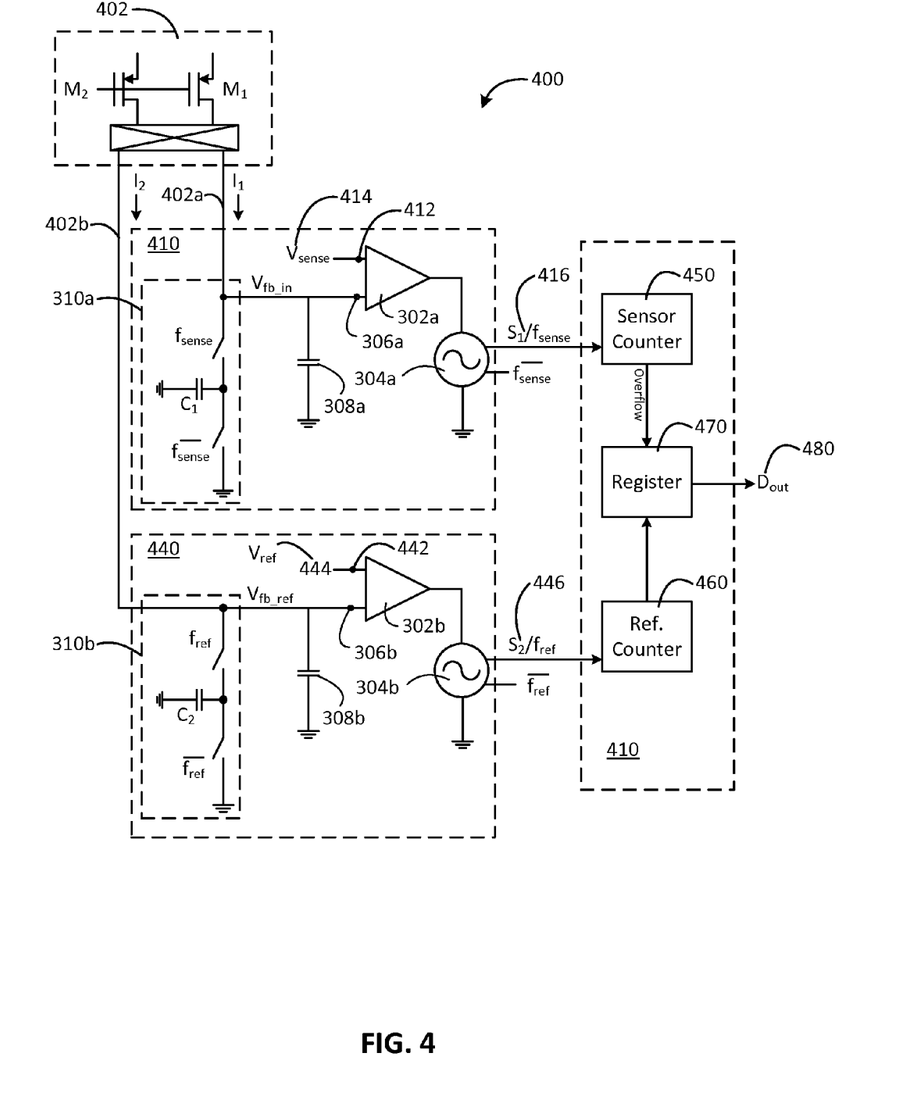
FIG. 4 is a schematic diagram of a linearized dual loop VCO-based ADC.

FIG. 4 is a schematic diagram of a linearized dual loop VCO-based ADC. In order to address the inverse proportionality between the input voltage 316 and $f_{out}$ of the closed loop VCO 300, two VCO-based ADCs can be implemented in a dual, closed loop arrangement.

The dual closed loop linearized VCO-based ADC (ADC) 400 can have a current source 402. In some embodiments, the current source can supply two bias currents 402a $I_1$ and 402b $I_2$. The bias current 402a $I_1$ and the bias current 402b $I_2$ can be supplied by the reference bias generator 204 (FIG. 2) and chopped to eliminate flicker noise and as a result, cycle jitter in the VCO loops. In some embodiments, the bias currents 402a $I_1$ and 402b $I_2$ can be supplied to the ADC 400 by other means used to provide a current.

In some embodiments, cycle jitter in the VCO loops can be exacerbated by flicker noise. The flicker noise itself can be a byproduct of the current sources (e.g., M1 and M2) supplying the bias currents 402a $I_1$ and 402b $I_2$. Low frequency components, such as within the switched-caps 310, can then negatively affect the output of the VCO loops (cycle jitter). In some examples, the cycle jitter can be as much as four least significant bits (LSB).

In general, the bias currents 402a $I_1$ and 402b $I_2$, in conjunction with the capacitor 308 can determine the frequency at which the ADC 400 operates. Therefore, the capacitance of the capacitors 308a, 308b can affect the frequency of the VCO 304 and the ADC 400. In some embodiments, for example, an oscillation frequency can be 1 gigahertz (GHz).

In some embodiments, the bias current 402a $I_1$ can be supplied to a sensor loop 410. Similarly, the bias current 402b $I_2$ can be supplied to a reference loop 440. Each of the sensor loop 410 and the reference loop 440 are shown in dashed lines and can incorporate an embodiment of the closed loop VCO 300 of FIG. 3.

In some embodiments, the components of the sensor loop 410 and the reference loop 440 can be similar to the closed loop VCO 300. The sensor loop 410 and the reference loop 440 can each have the amplifier 302, the VCO 304, and the switched-cap 310, among the other components listed above. Each of the common components is labeled with a letter (e.g., the VCO 304a for the sensor loop 410) for clarity. The lines representing the signals and their corresponding frequencies (e.g., $f_{out}$, $f_{out}$-bar) supplied to the switched-caps 310a, 310b of their respective sensor loop 410 and reference loop 440 are omitted for brevity.

The sensor loop 410 can have a sensor input 412 configured to receive a sensor voltage 414 ($V_{sense}$). The sensor voltage 414 $V_{sense}$ can be, for example, the $V_{be}$ of FIG. 2 of one of the main sensing unit 142 or the remote sensors 150. The MUX 202 can receive the $V_{be}$ voltages from the main sensing unit 142 and the remote sensors 150 and distribute it as the sensor voltage 414. The sensor loop 410 can also provide an output signal 416 ($S_1$) having a frequency $f_{sense}$, in a similar manner to the closed loop VCO 300. The output signal 416 $S_1$ can be fed back to control the switched-cap 310a as described in connection with FIG. 3. As noted above, the output frequency of a VCO is inversely proportional to the input voltage, thus frequency $f_{sense}$ of the output signal 416 $S_1$ is inversely proportional to the sensor voltage 414. The inverse relationship between the sensor voltage 414 and the frequency $f_{senses}$ of the output signal 416 $S_1$, can be described according to the equation:

$$V_{sense} = \frac{I_1}{f_{sense} \times C_1} \quad (1)$$

In equation (1), $V_{sense}$ is the sensor voltage 414 supplied by the main sensing unit 142 or one of the remote sensors 150, $I_1$ is the bias current 402a $I_1$, $f_{sense}$ is the frequency of the output signal 416 $S_1$ (of the sensor loop 410), and $C_1$ is a value of capacitance of the capacitor $C_1$ within the switched-cap 310a.

The reference loop 440 can be implemented in a similar manner to the sensor loop 410. The reference loop can have a reference input 442 configured to receive a reference voltage 444 ($V_{ref}$). The reference voltage 444 can be supplied, for example, by the reference bias generator 204. The reference voltage 444 can provide a baseline or reference to which the sensor voltage 414 can be compared using the ADC 400. The reference loop 440 can also provide an output signal 446 ($S_2$) having a frequency $f_{ref}$ that is used as feedback to control the switched-cap 310b. In addition, an inverted version of output signal 446 ($S_2$), having the frequency $f_{ref}$ of the, $f_{ref}$-bar, can also be used to control the switched-cap 310b. The relationship can be described by the equation:

$$V_{ref} = \frac{I_2}{f_{ref} \times C_2} \quad (2)$$

In equation (2), $V_{ref}$ is the reference voltage 444, $I_2$ is the bias current $I_2$ 402b, $f_{ref}$ is the frequency of the output signal 446 $S_2$ (of the reference loop 440), and $C_2$ is the capacitance of the capacitor labeled $C_2$ within the switched-cap 310b. Accordingly, equation (2) is similar to equation (1) in that it too provides for an inverse proportionality between the reference voltage 444 and the frequency $f_{ref}$ of the output signal 446. In some embodiments however, the frequency $f_{ref}$ of the output signal 446 ($S_2$) may generally vary less given a constant reference voltage 444 and bias current (e.g., the bias current 402b $I_2$). The reduced variation of the frequency $f_{ref}$ can provide a stable reference to which the $f_{sense}$ can be compared. In some embodiments, the frequency $f_{sense}$ can be constant.

In some embodiments, equation (1) and equation (2) can be combined and used to describe the relationship between the sensor voltage 414 $V_{sense}$ and the reference voltage 444 $V_{ref}$.

$$\frac{V_{sense}}{V_{ref}} = \frac{I_1 * C_2}{I_2 * C_1} * \frac{f_{ref}}{f_{sense}} \quad (3)$$

The sensor loop 410 can be operably coupled to a sensor counter 450. Similarly, the reference loop 440 can be operably coupled to a reference counter 460. The sensor counter 450 and the reference counter 460 can each be implemented as a digital counting circuit or counting logic. The sensor counter 450 and the reference counter 460 can store and relay a count of a number of times a particular event or process occurs. In some embodiments, the sensor counter 450 can provide a count based on the output signal 416 $S_1$, counting, for example, the frequency $f_{sense}$. For example, the sensor counter 450 can count the number of transitions in the output signal 416 according to the frequency $f_{sense}$. The sensor counter 450 can then provide, for example, a digital count of the output signal 416 $S_1$. The reference counter 460 can provide a similar digital count of the output signal 446 based on the frequency $f_{ref}$. In some embodiments, the sensor counter 450 and the reference counter 460 can be 16-bit counters.

The sensor counter 450 and the reference counter 460 can then each be operably coupled to a register 470. The register 470 can compare counts of the two frequencies (e.g., $f_{sense}$ and $f_{ref}$) and provide a normalized digital output 480 ($D_{out}$) representative of the ratio $V_{sense}/V_{ref}$ and $f_{ref}/f_{sense}$, as noted above in equation (3). The digital output 480 ($D_{out}$) can be inversely proportional in an increase in temperature on the IC 100. In some embodiments, the reference counter 460 can have the same counter rate over a range of temperatures given a relatively constant reference frequency, $f_{ref}$, providing a reference to which the sensor counter 450 can be compared.

The register 470 can then provide the digital output 480 $D_{out}$ described by the equation:

$$D_{out} = \frac{F_{ref}}{F_{sense}} = \frac{V_{sense}}{V_{ref}} \quad (4)$$

Thus, equation (4) can then describe the directly proportional relationship between the digital output 480 $D_{out}$ and the sensor voltage 414 $V_{sense}$.

For example, the sensor counter 450 can be configured to count 1023 steps (e.g., from 0 to 1023). The sensor counter 450 can receive the output signal 416 and count to 1023 in a continuous cycle. The reference counter 460 can receive the output signal 446 and conduct a similar count. The reference counter may not be limited to the same step count as the sensor counter 450.

In some embodiments, each time the sensor counter 450 reaches 1023, the register 470 can determine the count on the reference counter 460. At a given exemplary first temperature, the reference counter 460 may reach 512 counts when the sensor counter 450 reaches 1023 and starts its count over (e.g., an overflow condition). The count at which the overflow occurs at the sensor counter 450 can be determined by the register 470 as the rato $f_{ref}/f_{sense}$. In this example, the ratio is equal to 512/1023. According to equation (4), this also corresponds to the ratio of the sensor voltage 414 to the reference voltage 444. Therefore, the sensor voltage 414 is roughly half (512/1023=0.5) the reference voltage 444 in this example.

In general, the $V_{be}$ of a BJT, such as one implemented in the main sensing unit 142 or the remote sensors 150, is inversely proportional to temperature. Accordingly, in some embodiments, as the temperature at the main sensing unit 142 or the remote sensors 150 increases, the voltage $V_{be}$ supplied by the main sensing unit 142 and the remote sensors 150 (delivered as the sensor voltage 414 $V_{sense}$) will decrease. As the sensor voltage 414 decreases with increasing temp on the IC 100, the $f_{sense}$ of the output signal 416 increases, according to equation (1). As the sensor counter 450 continues its count to 1023, the increased temperature (e.g., $V_{sense}$) can cause the sensor counter 450 to reach 1023 faster than before. This can cause, for example, the reference counter 460 to reach only 400 in the same time the sensor counter 450 reaches 1023, given the increase in temperature and corresponding decrease in the sensor voltage 414 ($V_{sense}$). Therefore, the digital output 480 then becomes a ratio of 400/1023=0.39. This example shows a decrease from the ratio of 512/1023 indicating a proportional decrease of the digital output 480 $D_{out}$ in relation to an increase of temperature on the IC 100.

While the sensor loop 410 and the reference loop 440 are both described in connection with FIG. 4, in some embodiments, the reference loop 440 may not be necessary to provide the digital output 480. In some embodiments, the sensor loop 410 can be implemented independently of the reference loop 440. The reference loop 440 can be used to normalize or stabilize the digital output 480 based on nominal or minor variations in the baseline supply voltage, or the reference voltage 444. Therefore in some implementations, the reference loop 440 may not be required to provide a linearized digital output that is directly proportional to the sensor voltage 414 (e.g., $V_{be}$).

Figure 5:
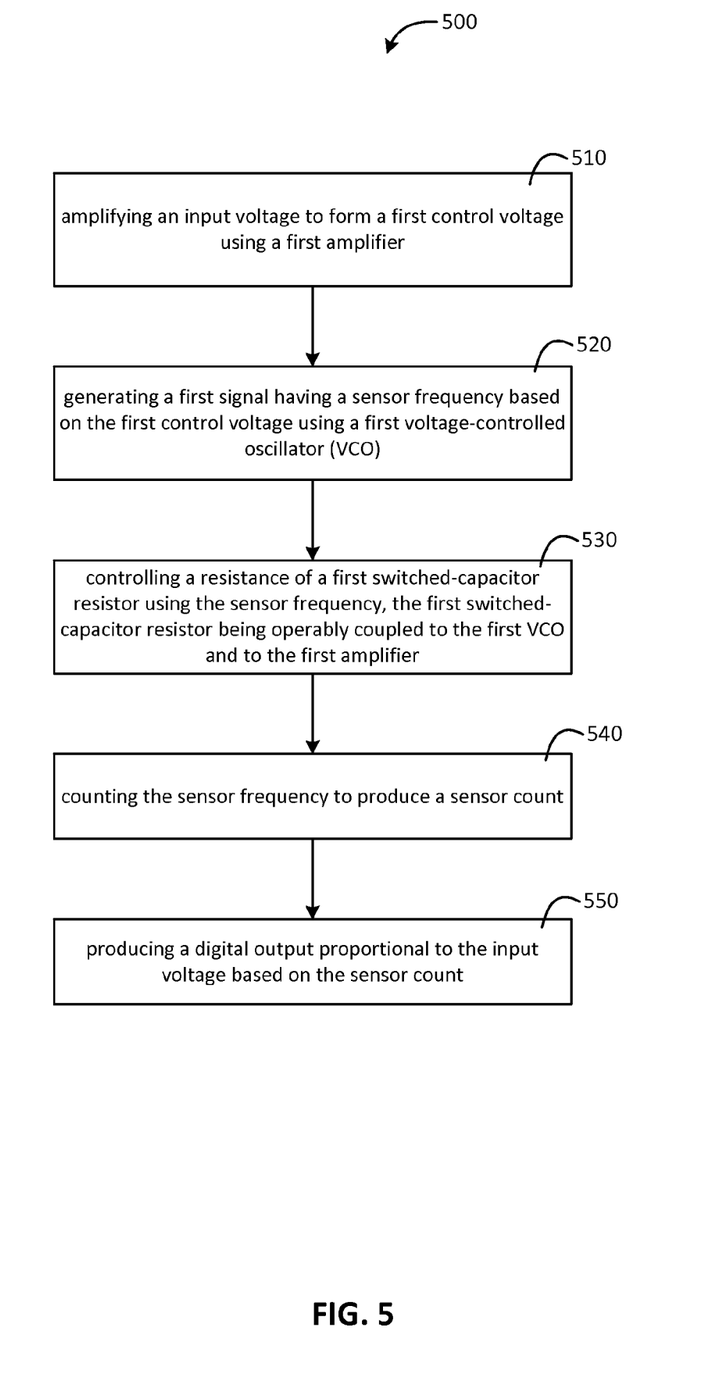
FIG. 5 is a flowchart of a method for measuring temperature with the linearized dual loop VCO-base ADC of FIG. 4.

FIG. 5 is a flowchart of a method for measuring temperature with the linearized dual loop VCO-base ADC of FIG. 4. The amplifier 302a, for example, can receive an input voltage. The input voltage can be, for example, the sensor voltage 414. As noted above, the sensor voltage 414 can correspond to the $V_{be}$ (or $V_{sense}$) of the remote sensors 150 or the main sensing unit 142. At block 510, the amplifier 302a can amplify the sensor input to form a first control signal. The amplifier 302a can also receive a bias current (e.g., the bias current 402a) and feedback via the switched-cap 310a to adjust the control signal. The control signal can be supplied to the VCO 304, for example.

At block 520, the VCO 304 can generate first signal having a sensor frequency based on the first control signal. The first signal can be the output signal 416 $S_1$, for example. The first signal can therefore have a sensor frequency and an inverted sensor frequency that can be supplied to a switched-capacitor resistor, the switched-cap 310a, for example.

At block 530, the output signal 416 $S_1$ and inverted output signal ($f_{sense}$-bar) can be used to control the switches (e.g., $Sw_1$ and $Sw_2$) of the switched-cap 310a. The frequency of the output signal 416 $S_1$ can therefore control the resistance of the switched-cap 310a. The output of the switched-cap 310a can then be fed back to the amplifier 302a to close the loop of the ADC 400 and of the sensor loop 410. The same processes of the block 510, the block 520, and the block 530 can be repeated for the reference loop 440. The output signal 416 $S_1$, can be provided to a counting circuit or counting logic such as, for example, the sensor counter 450.

At block 540, the sensor counter 450 can produce a count (e.g., the sensor count) at the frequency of the output signal 416 $S_1$. Accordingly, the sensor counter 450 can count the number of cycles of the output signal 416 $S_1$, and output a digital value to a register (e.g., the register 470). The reference loop can also implement a counter (e.g., the reference counter 460) that can output a similar digital value of a count of the cycles of the respective output signal (e.g., the output signal 446 $S_2$). The reference count can also be provided to the register. The reference count at the reference counter can be used as a reference to which the register 470 can compare the sensor count.

At block 550, the register (e.g., the register 470) can produce a digital output proportional to the input voltage (and inversely proportional to temperature) based on the sensor count. This output can be used to indicate variations in temperature across an IC (e.g., the IC 100).

In some embodiments, the register 470 can also generate the digital output 480 using a comparison of the sensor count to the reference count. In some embodiments, the sensor count varies directly with the input voltage (e.g., the input voltage 414). The method 500 can further produce the digital output 480 having a linear but indirect proportionality with the temperature across the IC.

Although embodiments of the disclosure are described above for particular embodiments, many variations of the disclosure are possible. For example, the numbers of various components may be increased or decreased, modules and steps that determine a supply voltage may be modified to determine a frequency, another system parameter, or a combination of parameters. Additionally, features of the various embodiments may be combined in combinations that differ from those described above.

Those of skill will appreciate that the various illustrative blocks described in connection with the embodiments disclosed herein can be implemented in various forms. Some blocks have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a block or step is for ease of description. Specific functions or steps can be moved from one block or distributed across to blocks without departing from the present disclosure.

The various illustrative logical blocks described in connection with the embodiments disclosed herein, for example, the modem 135, can be implemented or performed with a general purpose processor, a digital signal processor (DSP), application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such that the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the present disclosure. Various modifications to these embodiments will be readily apparent to those skilled in the art, and the generic principles described herein can be applied to other embodiments without departing from the spirit or scope of the present disclosure. Thus, it is to be understood that the description and drawings presented herein represent a presently preferred embodiment of the present disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A device for analog to digital conversion comprising:
   a first amplifier operable to receive an input voltage and output a first control signal;

a first voltage-controlled oscillator (VCO) operably coupled to the first amplifier and configured to output a first signal based on the first control signal, the first signal having a sensor frequency;

a first switched-capacitor resistor operably coupled to the first VCO and to the first amplifier, the first switched-capacitor resistor configured to receive and be controlled by the sensor frequency of the first signal;

a sensor counter operably coupled to the first VCO and configured produce a sensor count based on the sensor frequency of the first signal; and a register configured provide a digital output based on the sensor count.

2. The device of claim 1 further comprising:

a second amplifier operable to receive a reference voltage and output a second control signal;

a second VCO operably coupled to the second amplifier and configured to output a second signal having a reference frequency based on the second control signal;

a second switched-capacitor resistor operably coupled to the second VCO and the second amplifier, the second switched-capacitor resistor configured to receive and be controlled by the reference frequency of the second signal; and a reference counter operably coupled to the first VCO and configured produce a reference count based on the reference frequency of the second signal, wherein the register is further configured to provide the digital output based on the reference count and the sensor count.

3. The device of claim 2, wherein a value of the digital output is proportional to a value of the input voltage, the input voltage being indicative of a temperature on an integrated circuit.

4. The device of claim 2, wherein the reference frequency is inversely proportional to the reference voltage, and wherein the digital output is inversely proportional to the input voltage.

5. The device of claim 2, wherein the second switched-capacitor resistor is further controlled by the reference frequency of an inverted version of the second signal.

6. The device of claim 2 further comprising a first current source operably coupled to the first amplifier and a second current source operably coupled to the second amplifier, the first and second currents sources configured to supply a bias current to the respective first amplifier and the second amplifier.

7. The device of claim 1, wherein the first switched-capacitor resistor, the first VCO, and the first amplifier form a first closed loop.

8. The device of claim 6, further comprising a chopper configured to chop the bias current supplied from the first current source with the bias current supplied from the second current source.

9. The device of claim 1, wherein a resistance of the first switched-capacitor resistor is controlled by the sensor frequency and the sensor frequency of an inverted version of the first signal.

10. The device of claim 1, wherein the input voltage is received from at least one sensor of a plurality of sensors for measuring temperature distribution in an integrated circuit.

11. A method for analog to digital conversion comprising:

amplifying an input voltage to form a first control signal using a first amplifier;

generating a first signal having a sensor frequency based on the first control signal using a first voltage-controlled oscillator (VCO);

controlling a resistance of a first switched-capacitor resistor using the sensor frequency of the first control signal, the first switched-capacitor resistor being operably coupled to the first VCO and to the first amplifier;

counting the sensor frequency to produce a sensor count; and producing a digital output based on the sensor count.

12. The method of claim 11 further comprising:

amplifying a reference voltage to form a second control signal using a second amplifier;

generating a second signal having a reference frequency based on the second control signal using a second VCO;

controlling a second switched-capacitor resistor using the reference frequency of the second control signal, the second switched-capacitor resistor being operably coupled to the first VCO and to the second amplifier; and counting the reference frequency to produce a reference count, wherein the digital output is further based on the reference count.

13. The method of claim 12, wherein the reference frequency is inversely proportional to the reference voltage, and wherein the digital output is inversely proportional to the input voltage.

14. The method of claim 12, wherein the first switched-capacitor resistor is further controlled by the sensor frequency of an inverted version of the first control signal, and wherein the second switched-capacitor resistor is further controlled by the reference frequency of an inverted version of the second control signal.

15. The method of claim 11, wherein the sensor frequency is inversely proportional to the input voltage.

16. The method of claim 11, wherein the controlling is based on the sensor frequency and the sensor frequency of an inverted version of the first control signal.

17. The method of claim 11, wherein the input voltage is received from one of a plurality of sensors for measuring temperature distribution in an integrated circuit.

18. The method of claim 11 further comprising receiving the input voltage from one of a plurality of sensors for measuring temperature in an integrated circuit.

19. The method of claim 12 further comprising chopping a first bias current from a first current source for the first amplifier with a second bias current from a second current source for the second amplifier.

20. An apparatus for analog to digital conversion comprising:

means for amplifying an input voltage to form a first control signal;

means for generating a first signal having a sensor frequency based on the first control signal;

means for providing a first variable resistance based on the sensor frequency;

means for counting configured to count the sensor frequency to produce a sensor count; and means for producing configured to produce a digital output based on the sensor count.

21. The apparatus of claim 20 further comprising:

means for amplifying a reference voltage to form a second control signal;

means for generating a second signal having a reference frequency based on the second control signal;

means for providing a second variable resistance based on the reference frequency; and means for counting the reference frequency to produce a reference count, wherein the means for producing the digital output is further configured to produce the digital output based on the reference count.

22. The apparatus of claim 21 wherein:
the means for amplifying the input voltage, the means for generating the first signal, and the means for providing the first variable resistance are operably coupled to form a first closed loop; and
the means for amplifying the reference voltage, the means for generating the second signal, and means for providing the second variable resistance are operably coupled to form a second closed loop.

23. The apparatus of claim 21, wherein the reference frequency is inversely proportional to the reference voltage; and
wherein the digital output is inversely proportional to the input voltage.

24. The apparatus of claim 21, wherein:
the means for providing the first variable resistance is further configured to provide the first variable resistance based on the sensor frequency of an inverted version of the first signal; and
the means for providing the second variable resistance is further configured to provide the second variable resistance based on the reference frequency of an inverted version of the second signal.

25. The apparatus of claim 20, wherein a value of the digital output is proportional to a value of the input voltage, the input voltage being indicative of a temperature on an integrated circuit.

26. The apparatus of claim 20, wherein the means for providing the first variable resistance is further controlled by the sensor frequency of an inverted version of the first signal.

27. A device for analog to digital conversion comprising:
a first closed loop voltage controlled oscillator (VCO) having a sensor input configured to receive a sensor voltage, the first closed loop VCO loop being configured to generate a sensor signal having a sensor frequency inversely proportional to the sensor voltage;
a second closed loop VCO having a reference input configured to receive a reference voltage, the second closed loop VCO loop being configured to generate a reference signal having a reference frequency inversely proportional to the reference voltage;
an input counter operably coupled to the first closed loop VCO and configured produce an input count based on the sensor frequency;
a reference counter operably coupled to the second closed loop VCO and configured to produce a reference count based on the reference frequency; and
a register operably coupled to the input counter and the reference counter and configured to configured to provide a digital output proportional to the sensor input based on the input count and the reference count.

28. The device of claim 27, wherein:
the first closed loop VCO comprises a first switched capacitor resistor controlled by the sensor frequency of the sensor signal and an inverted version of the sensor signal generated by a first VCO; and
the second closed loop VCO comprises a second switched capacitor resistor controlled by the reference frequency of the reference signal and an inverted version of the reference signal generated by a second VCO.

29. The device of claim 27, wherein the digital output is directly proportional to the sensor voltage.

30. The device of claim 27, wherein the sensor voltage is received from one of a plurality of sensors for measuring temperature distribution in an integrated circuit, the sensor voltage being indicative of a value of a temperature at a location of the one of a plurality of sensors.

* * * * *